US009603275B2

(12) United States Patent
Kashiwakura

(10) Patent No.: US 9,603,275 B2
(45) Date of Patent: Mar. 21, 2017

(54) BLACKPLANE BOARD AND WIRING METHOD OF BACKPLANE BOARD

(71) Applicant: Kazuhiro Kashiwakura, Tokyo (JP)

(72) Inventor: Kazuhiro Kashiwakura, Tokyo (JP)

(73) Assignee: NEC CORPORATION, Tokyo (JP)

( * ) Notice: Subject to any disclaimer, the term of this patent is extended or adjusted under 35 U.S.C. 154(b) by 100 days.

(21) Appl. No.: 14/381,444

(22) PCT Filed: Mar. 13, 2013

(86) PCT No.: PCT/JP2013/001630
§ 371 (c)(1),
(2) Date: Aug. 27, 2014

(87) PCT Pub. No.: WO2013/145596
PCT Pub. Date: Oct. 3, 2013

(65) Prior Publication Data
US 2015/0131256 A1 May 14, 2015

(30) Foreign Application Priority Data

Mar. 27, 2012 (JP) ................. 2012-071412

(51) Int. Cl.
H05K 1/11 (2006.01)
H05K 7/02 (2006.01)
H05K 7/14 (2006.01)
G06F 1/18 (2006.01)
H05K 3/36 (2006.01)
H05K 1/14 (2006.01)

(52) U.S. Cl.
CPC ............ H05K 7/026 (2013.01); G06F 1/183 (2013.01); H05K 3/36 (2013.01); H05K 7/1459 (2013.01); H05K 2201/044 (2013.01); Y10T 29/49126 (2015.01)

(58) Field of Classification Search
CPC ................................. H05K 2201/044
USPC ........................................ 361/788
See application file for complete search history.

(56) References Cited

U.S. PATENT DOCUMENTS 5,122,691 A 6/1992 Balakrishnan
6,163,464 A 12/2000 Ishibashi et al.
(Continued)

FOREIGN PATENT DOCUMENTS

JP 58-52780 U 4/1983
JP 61-218080 A 9/1986
(Continued)

OTHER PUBLICATIONS

International Search Report (ISR) (PCT Form PCT/ISA/210), in PCT/JP2013/001630, dated May 14, 2013.
Form PCT/ISA/237 (English Version).

Primary Examiner — Binh Tran
(74) Attorney, Agent, or Firm — McGinn IP Law Group, PLLC

(57) ABSTRACT

The present invention is a backplane board including a first circuit board, a second circuit board, a first slot in which a first connector is connected with the first circuit board, and a second slot in which a second connector is connected with the second circuit board. The first connector and the second connector are arranged so that pin arrangement of the first connector may be shifted by at least one column in a longitudinal direction against pin arrangement of the second connector.

15 Claims, 14 Drawing Sheets

(56) References Cited

U.S. PATENT DOCUMENTS

| | | | |
|---|---|---|---|
| 6,335,867 B1 | 1/2002 | Ishibashi et al. | |
| 6,496,376 B1 * | 12/2002 | Plunkett | G06F 13/409 361/729 |
| 7,042,735 B2 | 5/2006 | Koga et al. | |
| 8,345,439 B1 * | 1/2013 | Goergen | H05K 7/1458 361/788 |
| 2003/0147375 A1 * | 8/2003 | Goergen | H05K 1/0228 370/351 |
| 2005/0083666 A1 | 4/2005 | Koga et al. | |

FOREIGN PATENT DOCUMENTS

| | | |
|---|---|---|
| JP | 5-314068 A | 11/1993 |
| JP | 8-306433 A | 11/1996 |
| JP | 11-53077 A | 2/1999 |
| JP | 2005-123362 A | 5/2005 |
| JP | 2005-149445 A | 6/2005 |

* cited by examiner

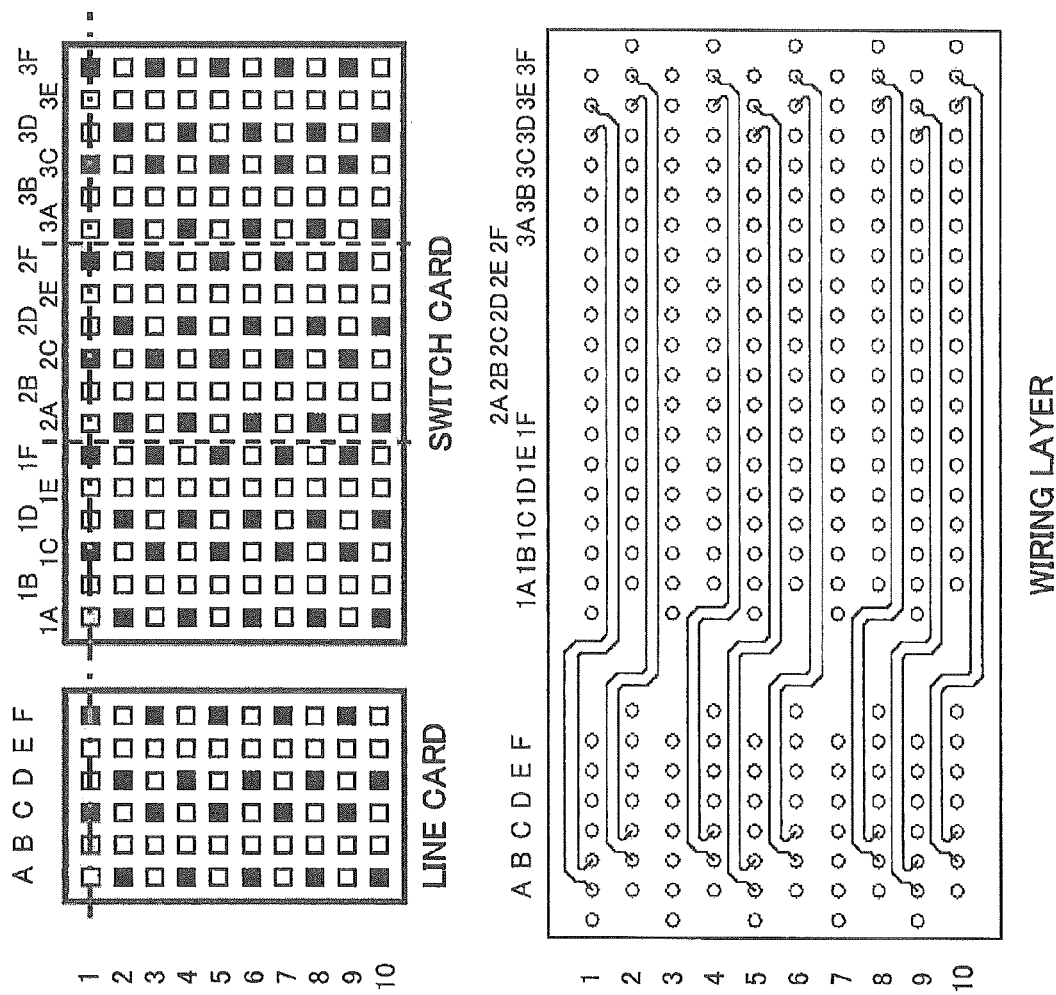

BLACKPLANE BOARD AND WIRING METHOD OF BACKPLANE BOARD

TECHNICAL FIELD

The present invention relates to a backplane board and a wiring method of the backplane board in an art of an electronic circuit board of a communication equipment, an information processing equipment or the like.

BACKGROUND ART

In recent years, a processing speed of a communication equipment and an information processing equipment becomes high, and particularly a transmission speed over 10 Gbps is requested in the case of backplane transmission. Similarly, a signal transmission speed between a line card and a switch card, which are used in a network apparatus, becomes high, and consequently limitation in a signal line length becomes strict in order to restrain a difference between the signal line lengths, and a signal loss.

FIG. 12 is a diagram showing composition of a backplane board of a general network apparatus. The general network apparatus includes two switch cards and a plurality of line cards mainly.

A line card 11 is equipped with a line interface like Ethernet, and is connected with another communication apparatus, PC, or the like. The line card 11 adds proprietary header information to a signal which is inputted from the line interface, and sends the signal, to which the proprietary header information is added, to a switch card 21.

The switch card 21 checks the header information which the line card 11 adds, and specifies a line card 11 which should provide an output of the network apparatus, and switches a path through the switch card 21, and sends the information to the line card 11 which should provide the output. The information, which is sent to the line card 11, is sent to another communication apparatus through the line interface.

Each signal line of each line card 11 is connected with two switch cards 21 through a connection on a backplane 31, and consequently the dual star topology is formed.

In recent years, a transmission speed between the line card and the switch card becomes high, and consequently limitation in the signal wiring length becomes strict in order to restrain the difference between the signal wiring lengths, and the signal loss. As a preceding art which realizes that high-speed transmission wirings have the same length, there is an art which is described in a patent literature 1 and a patent literature 2. The patent literature 1 and the patent literature 2 propose an art to make the difference between the wiring lengths null by arranging two boards, which are opposite each other, so that one board may be rotated by 90 degrees against the other board.

FIG. 13 is a diagram which is related to the patent literature 1 and which shows composition of a backplane board having implementation that one board out of two boards, which are opposite each other, is rotated by 90 degrees against the other board. FIG. 13 shows composition of a mutual connection apparatus, which can realize the same length wiring on a backplane board 1 with ease by making a logical circuit board 5 connected with the backplane board 1 vertically, and making a repeating board 2, which connects the logical circuit boards 5, connected with the backplane board 1 horizontally, and by assigning an area of a connector 6 of the logical circuit board 5, and an area of a connector 3 of the repeating board 2 properly.

PRECEDING TECHNICAL LITERATURE

Patent Literature

[Patent literature 1] Japanese Patent Application Laid-Open No. 1999-053077
[Patent literature 2] Japanese Patent Application Laid-Open No. 1993-314068

DESCRIPTION OF THE INVENTION

Problem to be Solved by the Invention

While the composition described in the patent literature 1 and the patent literature 2 has an apparent effect to make the difference in the wiring length null, there is a problem that the patent literature 1 and the patent literature 2 do not refer to making a layer low and reducing number of layers, and consequently a cost of the backplane increases. Moreover, there is a case that it is difficult to carry out forced air-cooling if there is a board which is arranged horizontally. In this case, a problem that it is necessary to reduce power consumption up to such a degree that natural air-cooling can cope.

Furthermore, since a processing speed of the communication equipment and the information processing equipment becomes high, and especially a transmission speed over 10 Gbps is required for backplane transmission, there is a problem that it is requested to make a wiring length short and to make a wiring straight in order to prevent signal attenuation due to the wiring.

An object of the present invention is to provide a backplane board, and a wiring method of the backplane board which are able to realize reducing number of layers of the backplane board and designing a wiring whose length is short and which is straight.

Means for Solving the Problem

The present invention, which is a backplane board including a first circuit board, a second circuit board, a first slot in which a first connector is connected with the first circuit board, and a second slot in which a second connector is connected with the second circuit board, is comprising the first connector and the second connector are arranged so that pin arrangement of the first connector may be shifted by at least one column in a longitudinal direction against pin arrangement of the second connector.

The present invention, which is a wiring method of a backplane board including a first circuit board, a second circuit board, a first slot in which a first connector is connected with the first circuit board, and a second slot in which a second connector is connected with the second circuit board, is characterized in that the first connector and the second connector are arranged so that pin arrangement of the first connector may be shifted by at least one column in a longitudinal direction against pin arrangement of the second connector, and the first connector and the second connector are aligned in a state of almost straight line to be connected each other.

Advantageous Effect of the Invention

According to the present invention, it is possible to reduce number of bent wirings maximum on the backplane. Moreover, according to the present invention, it is possible to reduce number of layers of the backplane board, and to design the backplane with good characteristics.

BRIEF DESCRIPTION OF THE DRAWINGS

FIG. 5 is a connection diagram which is obtained in the case that pin arrangement of a connector of a line card is not shifted by one column against pin arrangement of a connector of a switch card in a wiring layer of a backplane system.

EMBODIMENT FOR CARRYING OUT THE INVENTION

Hereinafter, a preferred embodiment for carrying out the present invention will be explained with reference to a drawing. While an exemplary embodiment described in the following is limited preferably in a technological aspect in order to carry out the present invention, scope of the invention is not limited to the following description.

First Exemplary Embodiment

The present exemplary embodiment will be explained in detail with reference to a drawing.

Figure 1:
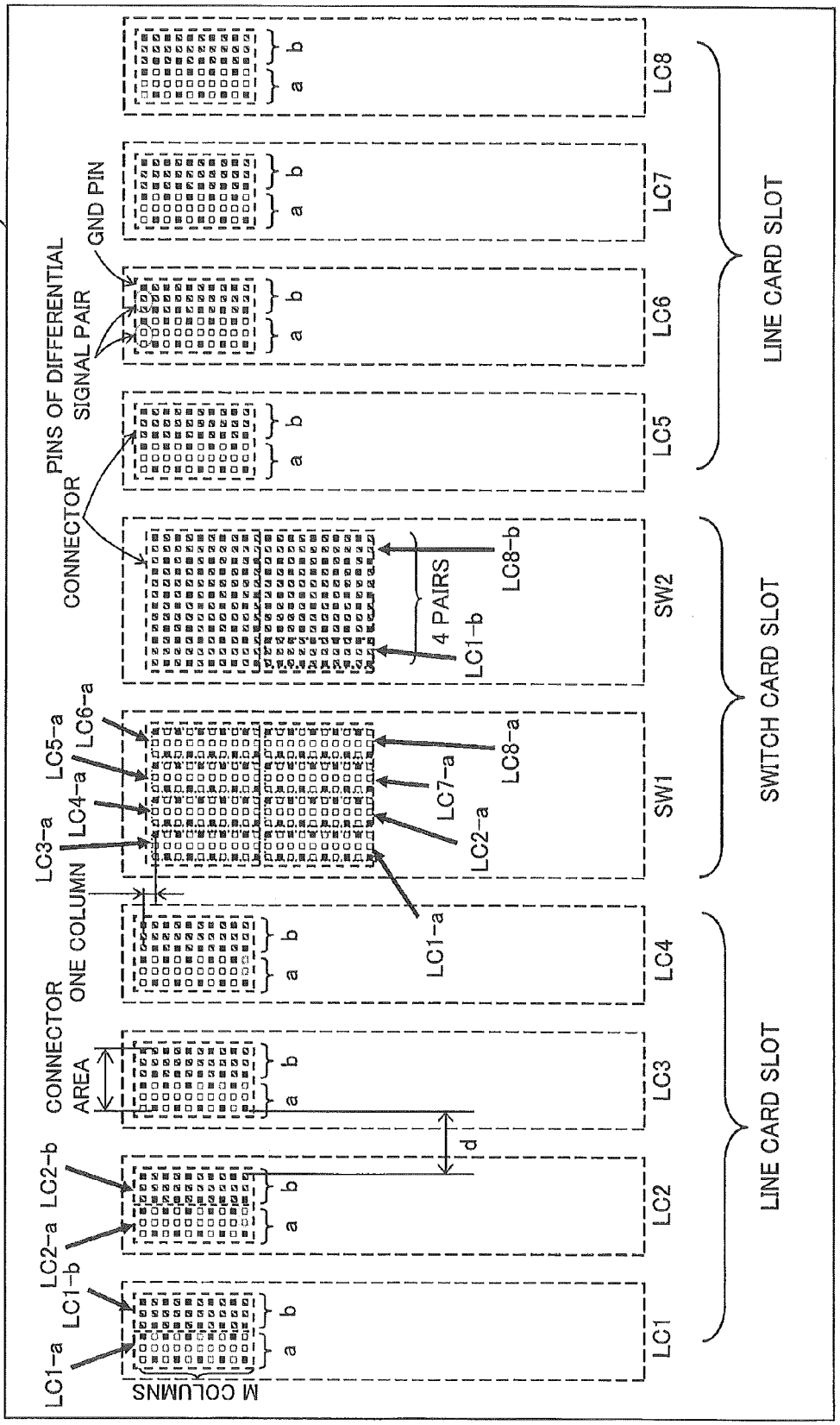
FIG. 1 is a diagram showing composition of implementation of a backplane board in an exemplary embodiment of the present invention.

FIG. 1 is a diagram showing composition of implementation of a backplane board in the exemplary embodiment of the present invention. According to the implementation of the backplane board 10 shown in FIG. 1, a line card uses a 2 pairs type connector. Moreover, a switch card uses a 2N pairs type connector (N is a natural number) such as a 4 pairs type connector and a 6 pairs type connector. The switch card shown in FIG. 1 is an example of using the 4 pairs type connector.

Figure 12:
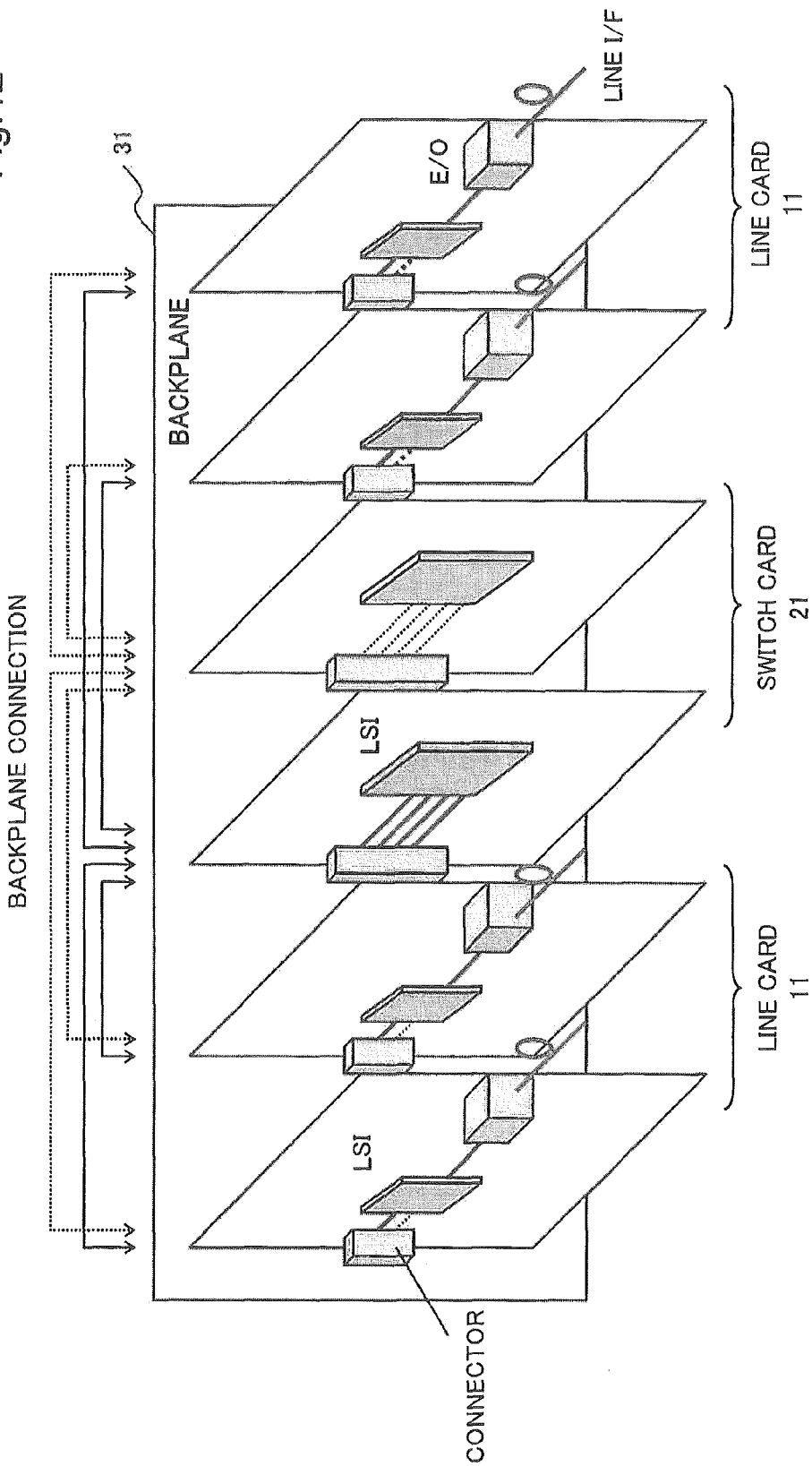
FIG. 12 is a diagram showing composition of a backplane board of a general network apparatus.
Figure 13:
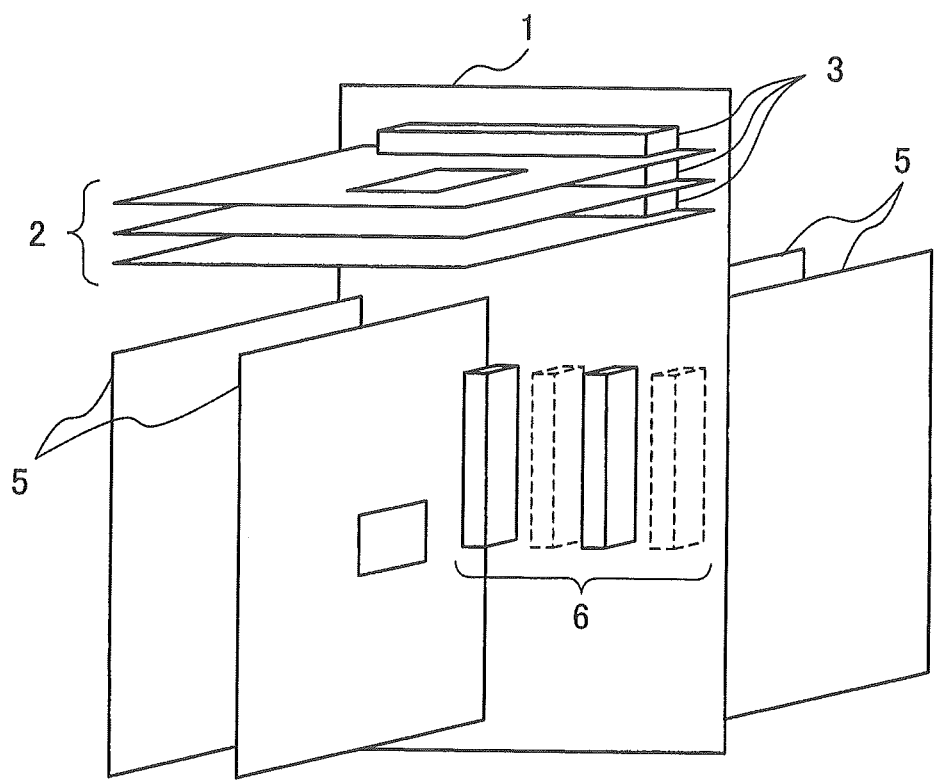
FIG. 13 is a diagram showing composition of a backplane board which has implementation that one board out of two boards, which are opposite each other, is rotated by 90 degrees against the other board.

Composition of the whole backplane board and a circuit board in the present exemplary embodiment is similar to the composition shown in FIG. 12. The line card (first circuit board) and the switch card (second circuit board) shown in FIG. 1 are corresponding to the line card 11 and the switch card 21 shown in FIG. 12.

As shown in FIG. 1, switch card slots SW 1 and SW 2 are arranged in the vicinity of a center of the backplane board 10. Moreover, line card slots LC 1 to LC 4, and LC 5 to LC 8 are arranged on the left side and the right side of the switch card slots respectively. Here, an interval between the line card slots is set not shorter than an interval d which is calculated by use of the following formula.

$$d = ((\text{wiring width} \times 2 + \text{interval between differential lines}) + \text{interval between pairs of differential lines}) \times M + \text{connector area}$$

where M is number of columns of a connector. Moreover, the wiring width, the interval between differential lines, and the interval between pairs of differential lines will be described later.

As shown in FIG. 1, a connector of the line card slot LC 1 is divided into two areas of an area a and an area b. The area a means 3 rows×10 columns on the left side of the connector area. Similarly, the area b means 3 rows×10 columns on the right side of the connector area. Then, both areas are denoted as LC 1-*a* and LC 1-*b* respectively. These two areas, which are divided, are connected with the switch card slots SW 1 and SW 2 respectively. That is, the area LC 1-*a* of the line card slot LC 1 is connected with an area LC 1-*a* which is shown on the lower left side of the switch card slot SW 1. Similarly, the area LC 1-*b* of the line card slot LC 1 is connected with an area LC 1-*b* which is shown on the lower left side of the switch card slot SW 2.

Moreover, an area LC 2-*a* of the line card slot LC 2 is connected with an area LC 2-*a* which is next to the area LC 1-*a* shown on the lower left side of the switch card slot SW 1. An area LC 3-*a* of the line card slot LC 3 is connected with an area LC 3-*a* which exists on the upper left side of the switch card slot SW 1. Moreover, an area LC 6-*a* of the line card slot LC 6 is connected with an area LC 6-*a* which exists on the upper right side of the switch card slot SW 1. Furthermore, an area LC 8-*a* of the line card slot LC 8 is connected with an area LC 8-*a* which exists on the lower right side of the switch card slot SW 1.

As mentioned above, each line card and each switch card are connected each other through the areas LC 1-*a* to LC 8-*b* respectively.

Furthermore, the switch card slots SW1 and SW2 are arranged so as to be shifted downward by one column of the connector against the line card slots LC 1 to LC 8 on the backplane board 10.

Figure 2:
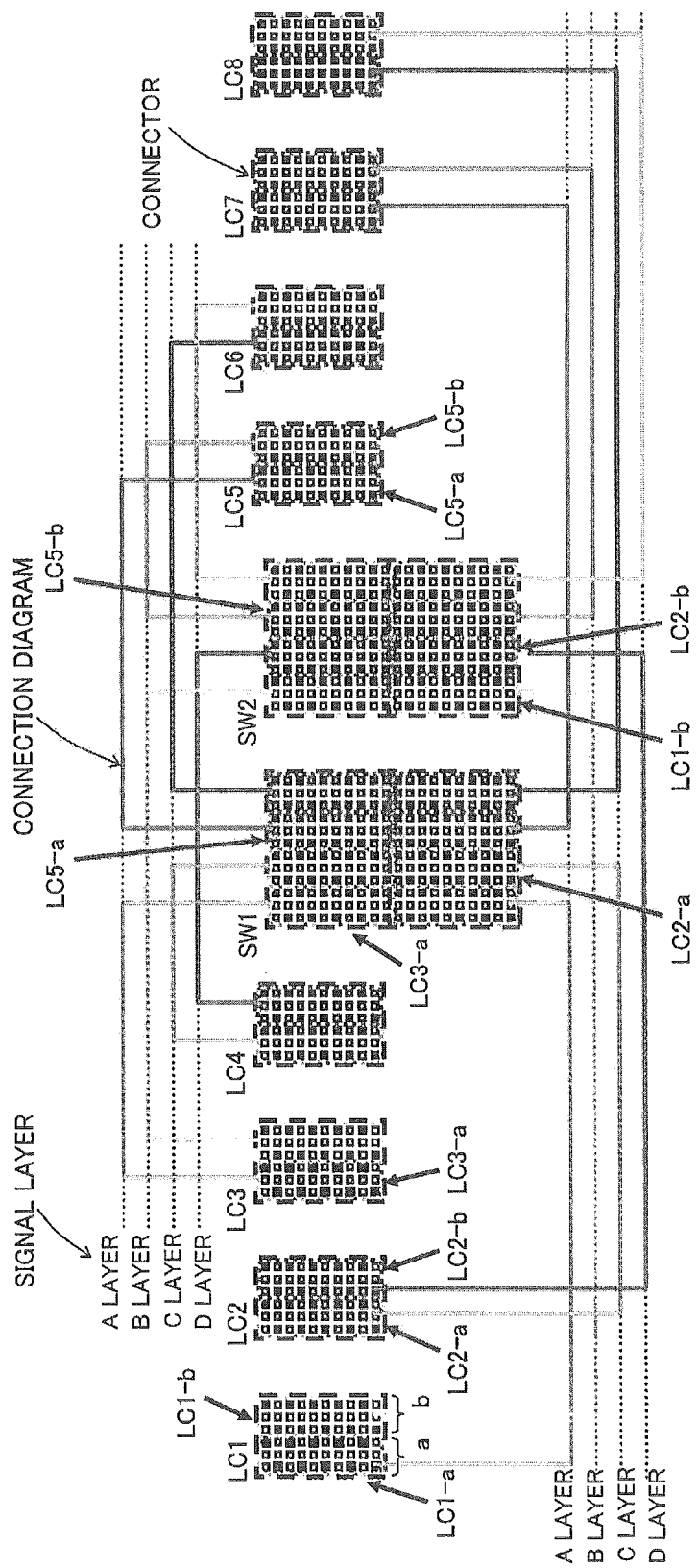
FIG. 2 is a diagram showing an image of a wiring of the backplane board in the exemplary embodiment of the present invention.
Figure 3A:
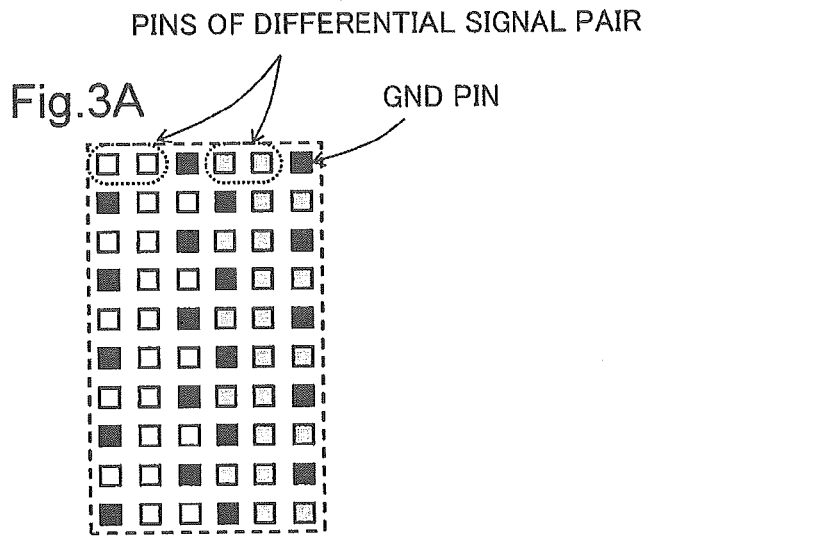
FIG. 3A is a diagram showing an image of pin arrangement of a 2 pairs type connector of the backplane board in the exemplary embodiment of the present invention.
Figure 3B:
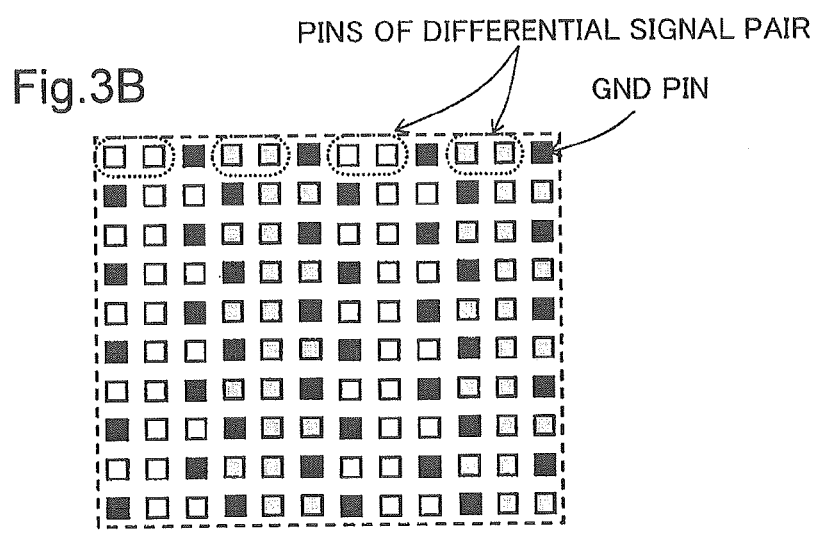
FIG. 3B is a diagram showing an image of pin arrangement of a 4 pairs type connector of the backplane board in the exemplary embodiment of the present invention.
Figure 3C:
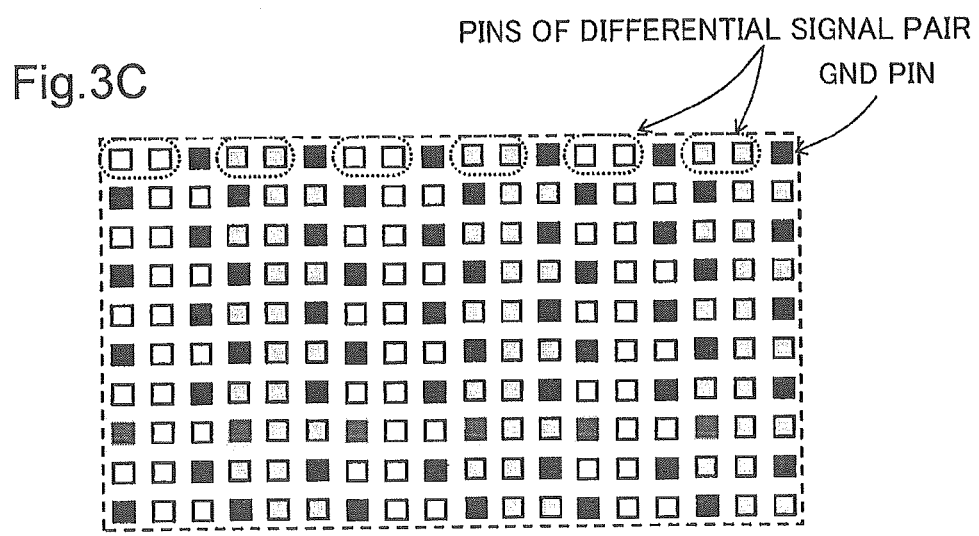
FIG. 3C is a diagram showing an image of pin arrangement of a 6 pairs type connector of the backplane board in the exemplary embodiment of the present invention.
Figure 3D:
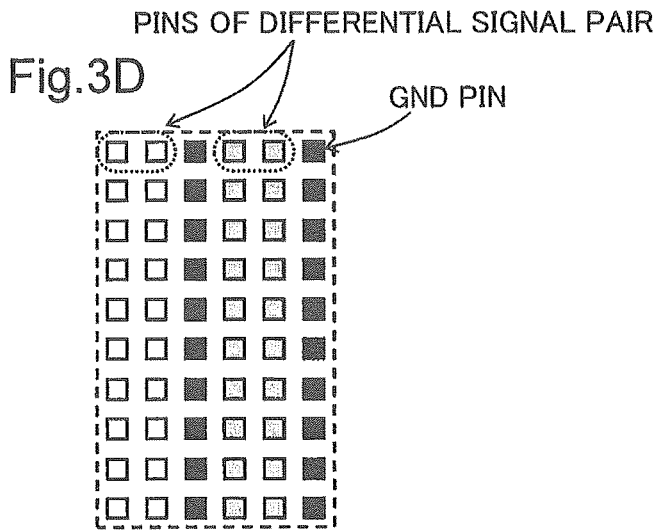
FIG. 3D is a diagram showing an image of pin arrangement of the 2 pairs type connector of the backplane board in the exemplary embodiment of the present invention.
Figure 3E:
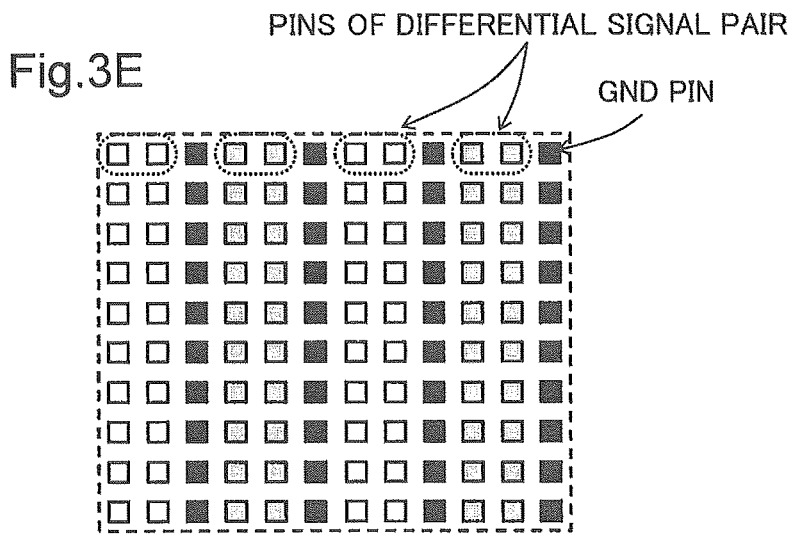
FIG. 3E is a diagram showing an image of pin arrangement of the 4 pairs type connector of the backplane board in the exemplary embodiment of the present invention.
Figure 3F:
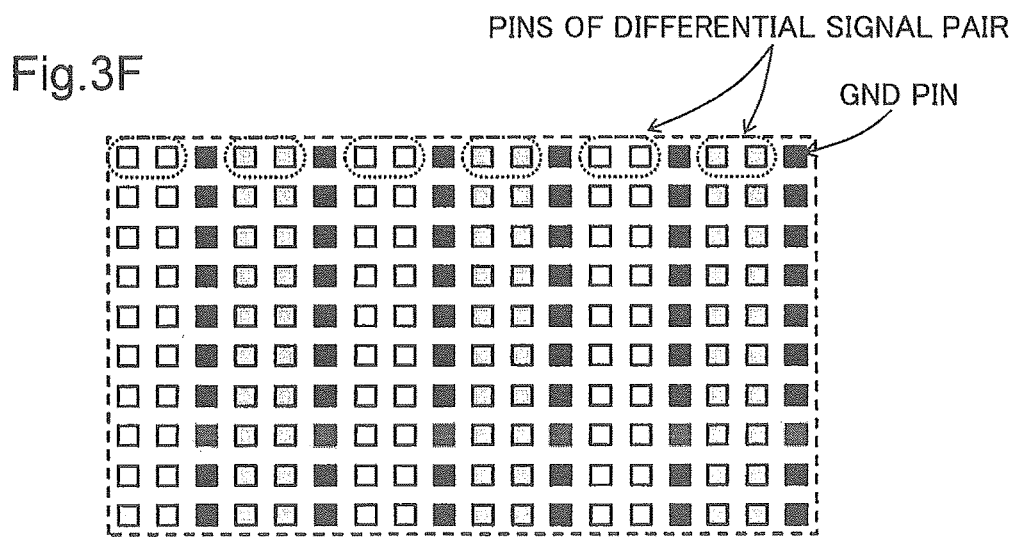
FIG. 3F is a diagram showing an image of pin arrangement of the 6 pairs type connector of the backplane board in the exemplary embodiment of the present invention.

FIG. 2 is a diagram showing an image of a wiring of the backplane board shown in FIG. 1. Here, LC means a slot and a connector which are used for the line card, and SW means a slot and a connector which are used for the switch card. The 2 pairs type connector is used on the line card LC, and the 4 pairs type connector is used on the switch card SW.

FIG. 3 shows an example of an image of pin arrangement of the connector of the backplane board. A connector which includes 2 pairs of differential pins per one column is defined as a 2 pairs type, and a connector including 4 pairs of differential pins per one column is defined as a 4 pairs type, and a connector including 6 pairs of differential pins per one column are defined as a 6 pairs type. In the case of considering the 2 pairs type shown in FIG. 3A as an example, one row includes a combination of 2 pairs of differential signal pins and two ground pins. Since the connector includes 10 columns, the connector have 6×10=60 pins. Similarly, the 4 pairs type connector shown in FIG. 3B has 120 pins, and the 6 pairs type connector shown in FIG. 3C has 180 pins. Moreover, FIG. 3D, FIG. 3E and FIG. 3F show examples in which wirings of the 2 pairs type connector, the 4 pairs type connector and the 6 pairs type connector align in the same direction respectively.

A connection of the wiring will be described in the following with reference to FIG. 2. Name of each slot is identical with one assigned in FIG. 1.

The line card slots LC 1, LC 2, LC 7 and LC 8 are connected with a lower side connector of the switch card slots SW 1 and SW 2. Moreover, the line card slots LC 3, LC 4, LC 5 and LC 6 are connected with an upper side connector of the switch card slots SW 1 and SW 2. Furthermore, the line card slots LC 1-*a* and LC 3-*a* are connected with LC 1-*a* and LC 3-*a* of the switch card slot SW 1 respectively. Moreover, the line card slots LC 1-*b* and LC 3-*b* are connected with LC 1-*b* and LC 3-*b* of the switch card slot SW 2 respectively. Similarly, the line card slots LC 2-*a* and LC 4-*a* are connected with LC 2-*a* and LC 4-*a* of the switch card SW 1 respectively, and LC 2-*b* and LC 4-*b* are connected with LC 2-*b* and LC 4-*b* of the switch card SW 2. FIG. 2 is a connection diagram which is obtained by wiring other connections according to the same rule. A switch card slot and a position in the switch card slot with which a line card slot should be connected are set so that number of wiring layers may become minimum, and length of each wiring may become the same maximum.

FIG. 2 shows assignment of a wiring to a signal layer which exists within the backplane board 10. In the case that columns of the connector are denoted as 1, 2, ... from the top, and a pin of the line card and a pin of the switch card which have the same column number are connected each other, the connection diagram shown in FIG. 2 indicates that it is possible to design whole connections by use of 4 signal layers.

Figure 4A:
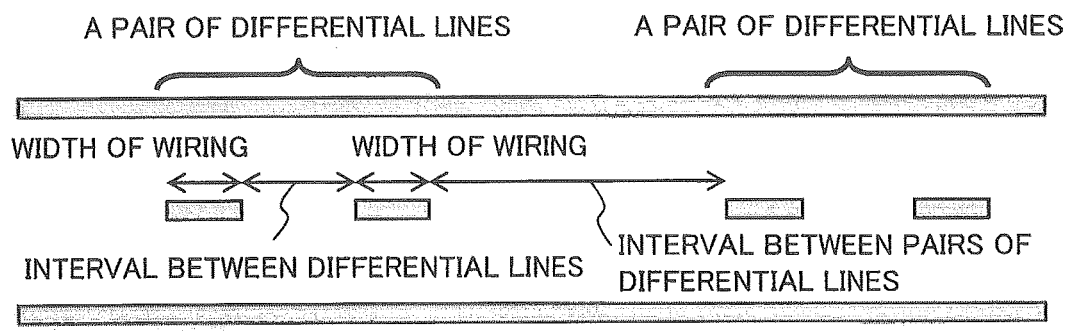
FIG. 4A is a diagram showing an image of a width which is obtained in the case of wiring a pair of differential lines of the backplane board in the exemplary embodiment of the present invention.
Figure 4B:
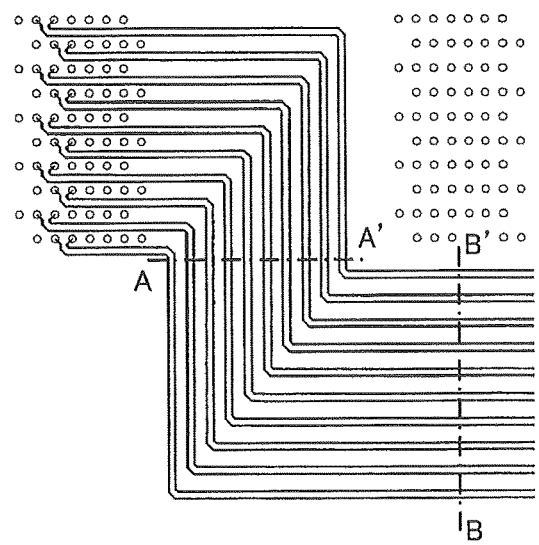
FIG. 4B is a diagram showing an image of a wiring between slots of the backplane board in the exemplary embodiment of the present invention.

FIG. 4 shows a wiring rule prescribed on the backplane board, and an image of a wiring between the slots. FIG. 4A is a diagram showing an image of a width which is obtained in the case of wiring a pair of differential lines. The interval between differential lines exists between two wiring widths, and the interval between pairs of differential lines exists between adjacent pairs of the differential lines. FIG. 4B is a diagram showing an image of the wiring between the slots. Since number of wirings, which is corresponding to number of the columns of the connector, is needed in an area A-A', the slot interval which is equal to ((wiring width×2+interval between differential lines+interval between pairs of differential lines)×number of columns+connector area) is secured. Since it is possible to secure the wiring area if a longitudinal area of the connector is secured in an area B-B', an area for securing the wiring area shown in FIG. 1 is left vacant.

An effect, which is obtained through shifting the connector of the present invention by one column, will be described in the following with reference to FIG. 5 and FIG. 6.

FIG. 5 shows a connector of the line card and a connector of the switch card of a backplane system which is used in a network apparatus or the like, and a connection diagram between the connector of the line card and the connector of the switch card in a wiring layer of the backplane system. FIG. 5 is a diagram which is obtained in the case that pin arrangement of the connector of the line card is not shifted by one column against pin arrangement of the connector of the switch card. Here, one line card and one switch card which is corresponding to the line card are extracted. The connector pins of the line card, whose column is assigned an alphabet and whose row is assigned a numerical number as shown in FIG. 5, will be explained in the following. That is, in FIG. 5, the columns are denoted as A, B, C, D, E, and F from the upper left respectively, and the rows are denoted as 1 to 10 from the top respectively. A pin on the upper left side is denoted as 1-A, and a next pin of the first row is denoted as 1-B, ... , 1-F in turn, and pins of the second row are denoted as 2-A, 2-B, ... , 2-F.

Similarly, a connector pin of the switch card is also assigned a number. In the case that columns of the switch card are denoted as 1A, 1B, 1C, ... , 3E, and 3F, pin numbers are denotes as 1-1A, 1-1B, ... , and 1-3F.

Similarly, a pattern of wiring layer is assigned a number which is the same as the number of each corresponding connector pin.

In the case that a top of the pin arrangement of the line card connector and a top of the pin arrangement of the switch card connector align as shown in FIG. 5, the pins of both connectors align in a state of a straight line.

Here, in the case that 1A of the line card connector and 1-3D of the switch card connector are connected each other, and 1B of the line card connector and 1-3E of the switch card connector are connected each other, a connection diagram is shown in the figure. That is, a wiring, which starts upward from 1A, changes its direction by 90 degrees (first time) and goes toward the switch card. Then, the wiring changes the direction downward in front of the switch card (second time). When the wiring passes a pin of the switch card, the wiring changes the direction by 90 degrees immediately (third time). Then, the wiring changes the direction upward at a point of 1-3D of the switch card (fourth time) to be connected with a pattern of 1-3D. As mentioned above, the wiring changes its direction four times totally, and consequently the wiring is caused attenuation due to a bent wiring.

Figure 6:
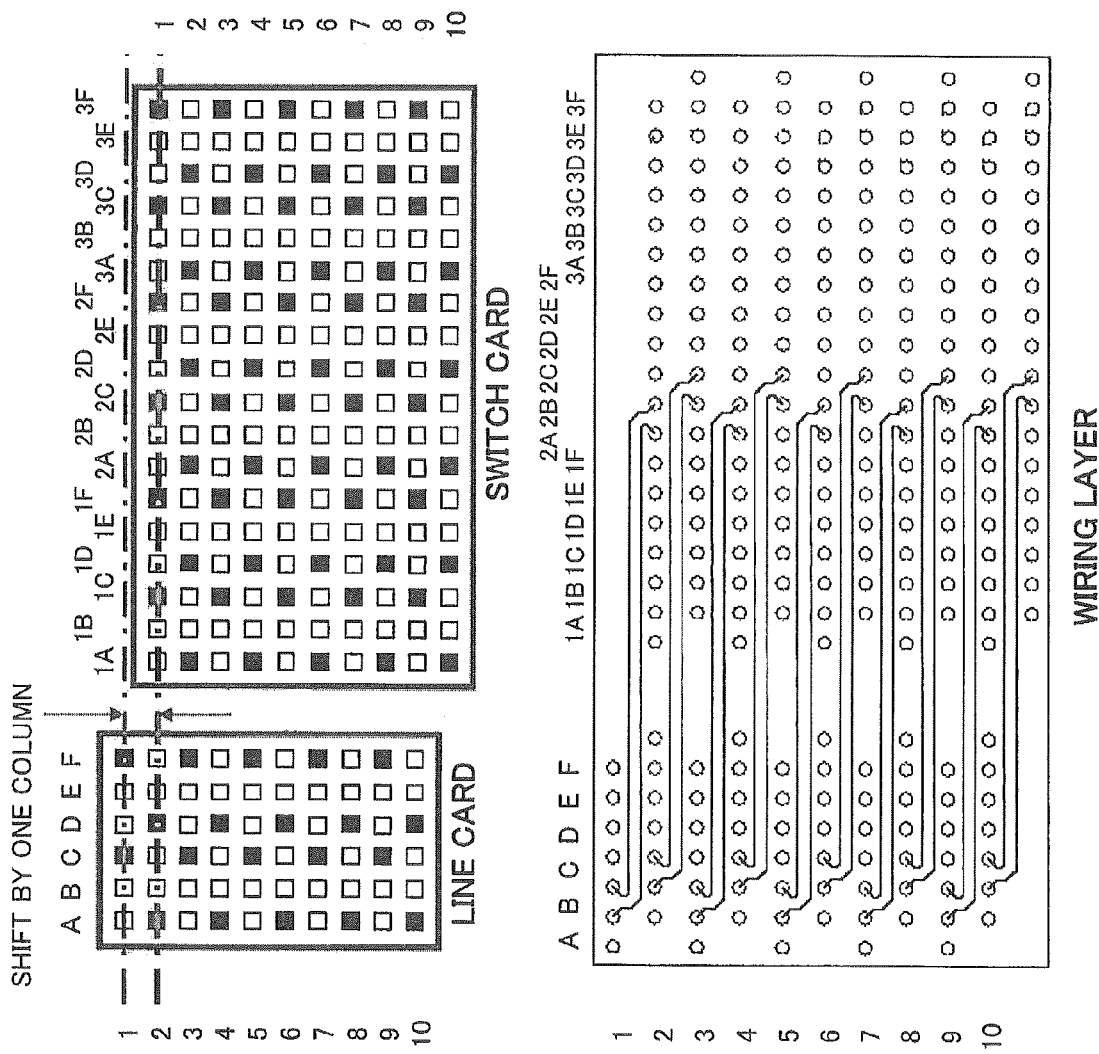
FIG. 6 is a connection diagram which is obtained in the case that the pin arrangement of the connector of the line card is shifted by one column against the pin arrangement of the connector of the switch card in the wiring layer of the backplane system according to the exemplary embodiment of the present invention.

FIG. 6 shows a connector of the line card and a connector of the switch card of the backplane system, and a connection diagram between the connector of the line card and the connector of the switch card in the wiring layer of the backplane system. FIG. 6 is a diagram which is obtained in the case that pin arrangement of the connector of the line card is shifted by one column against pin arrangement of the connector of the switch card. Here, one line card and one switch card corresponding to the line card are extracted. The connector pins of the line card, whose column is assigned an alphabet and whose row is assigned a numerical number as shown in FIG. 6, will be explained in the following. That is, in FIG. 6, the columns are denoted as A, B, C, D, E and F from the upper left, and the rows are denoted as 1 to 10 from the top. A pin on the upper left side is denoted as 1-A, and a next pin to 1-A in the first row is denoted as 1-B, . . . , 1-F in turn, and pins of the second row are denoted as 2-A, 2-B, . . . , 2-F.

Similarly, a connector pin of the switch card is also assigned a number. In the case that columns of the switch card are denoted as 1A, 1B, 1C, . . . , 3E and 3F, pin numbers are denoted as 1-1A, 1-1B, . . . , and 1-3F.

Similarly, a pattern of wiring layer is assigned a number which is the same as the number of each corresponding connector pin.

As shown in FIG. 6, the line card connector and the switch card connector are arranged so that pin arrangement of the line card connector is shifted by one column against pin arrangement of the switch card connector.

Here, in the case that 1A of the line card connector and 1-2A of the switch card connector are connected each other, and 1B of the line card connector and 1-2B of the switch card connector are connected each other, a connection diagram is shown in the figure. That is, a wiring, which starts downward from 1A, changes its direction by 90 degrees (first time) and goes toward the switch card. Then, the wiring changes the direction downward at a point of 1-2A of the switch card (second time) to be connected with a pattern of 1-2A. Since the wiring changes its direction two times totally as mentioned above, number of bend wirings is small in comparison with the case of changing the direction four times as shown in FIG. 5 (FIG. 5 shows the case that the pin arrangement is not shifted by one column), and consequently attenuation due to the bent wiring becomes small.

Figure 7:
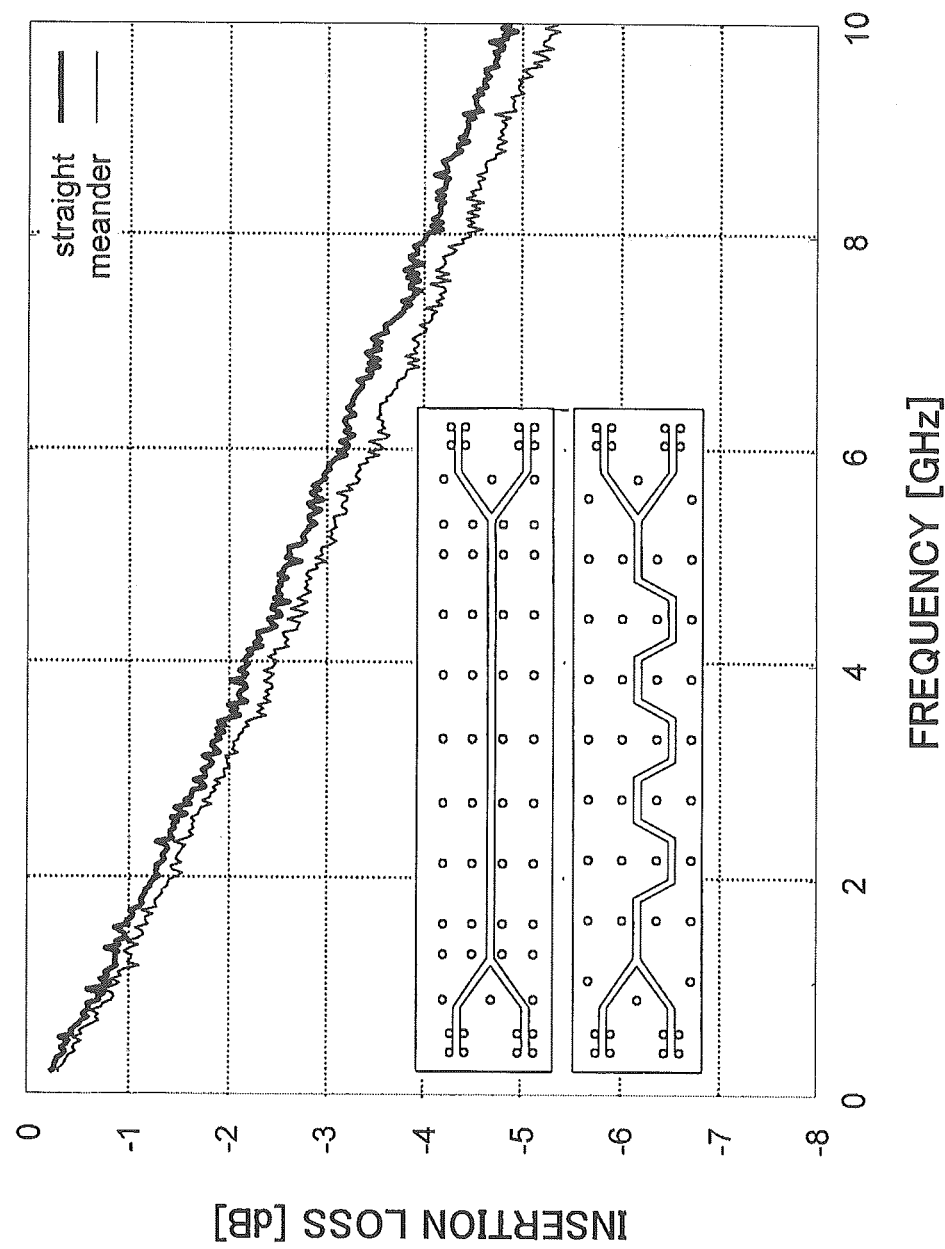
FIG. 7 is a diagram showing comparison between insertion losses of a straight wiring and a meander wiring.

Comparison between insertion losses of a straight wiring and a bent wiring (meander wiring) will be explained in the following with reference to FIG. 7.

In the case of a high speed signal, signal attenuation due to the wiring becomes a problem. It is generally known that as a wiring length is long, attenuation becomes large. Moreover, as another factor of the signal attenuation, a bent wiring (meander wiring) problem exists. FIG. 7 shows the comparison between the insertion losses of the straight wiring and the meander wiring. The horizontal axis and the vertical axis of the graph mean insertion loss and frequency respectively. It is found out that the insertion loss of the meander wiring becomes large as the frequency becomes high. It is apparent from this data that if a backplane board includes the bent wiring, the backplane board is caused a large loss. By virtue of the present invention, it is possible to reduce number of the bent wirings on the backplane board, and to design the backplane board with good characteristics.

Figure 8:
FIG. 8 is a diagram showing an example of designing a backplane wiring in the exemplary embodiment.

As an example of designing the backplane wiring according to the above-mentioned rule, FIG. 8 show a case of 12 line card slots. In this case, a connector which the switch card uses is the 6 pairs type connector. The wirings between the line card and the switch card are realized by use of 6 layers. In the figure, A layer includes wirings from LC 1 and LC 4 to SW 1, and wirings from LC 7 and LC 10 to SW 1. Next, B layer includes wirings from LC 1 and LC 4 to SW 2, and wirings from LC 7 and LC 10 to SW 2. C layer includes wirings from LC 2 and LC 5 to SW 1, and wirings from LC 8 and LC 11 to SW 1. D layer includes wirings from LC 2 and LC 5 to SW 2, and wirings from LC 8 and LC 11 to SW 2. E layer includes wirings from LC 3 and LC 6 to SW 1, and wirings from LC 9 and LC 12 to SW 1. F layer includes wirings from LC 3 and LC 6 to SW 2, and wirings from LC 9 and LC 12 to SW 2. By virtue of the wirings mentioned above, it is possible to design the straight and shortest wiring except for the bent wiring which is used as a lead wiring from the connector and a longitudinal wiring between the slots.

Modification 1

Figure 9:
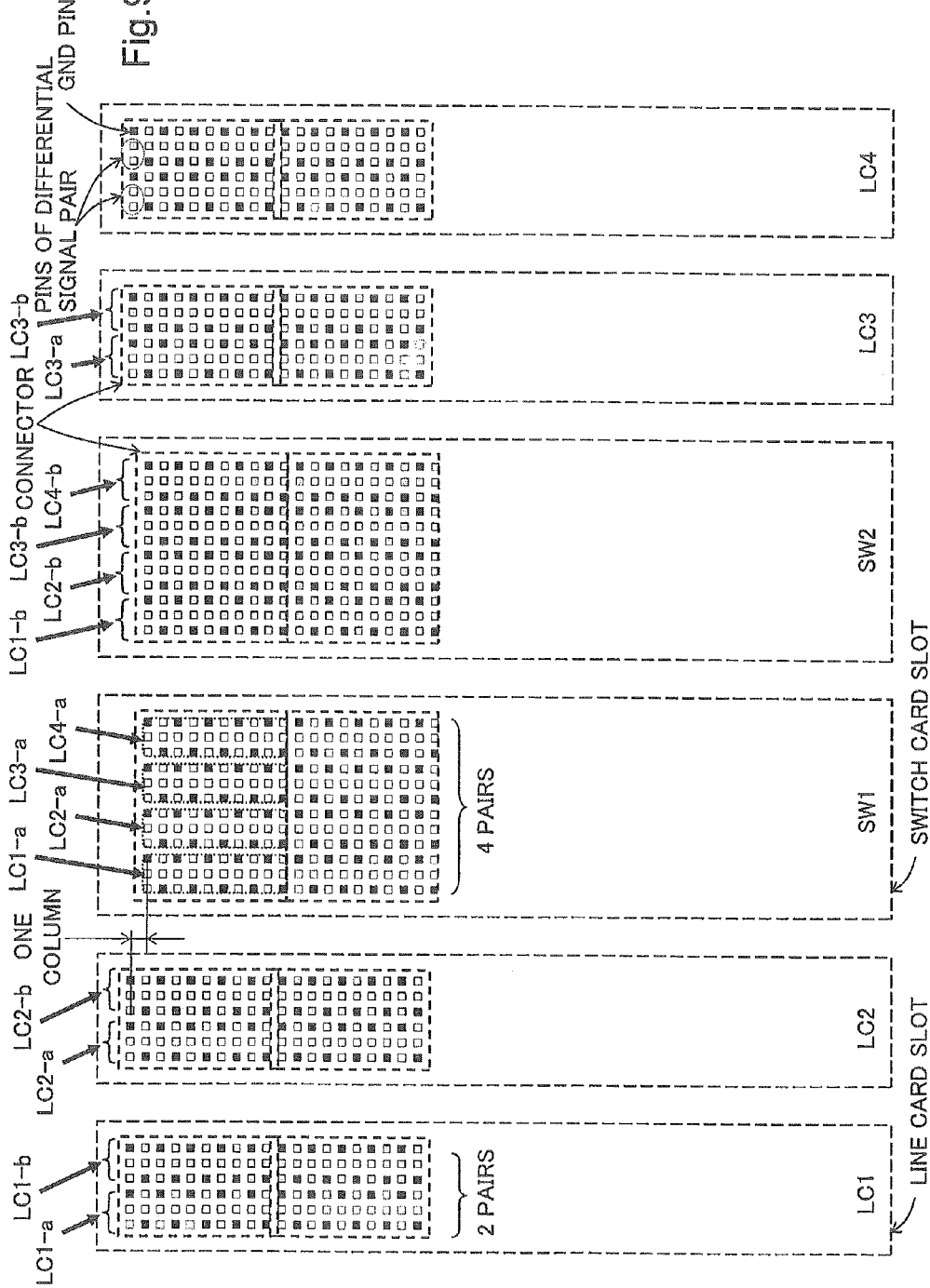
FIG. 9 is a diagram showing composition of a backplane board in a modification in which number of slots is 4.

As a modification 1, FIG. 9 show a backplane board whose number of line card slots is 4. A switch card uses the 4 pairs type connector. As shown in FIG. 9, the switch card slots SW 1 and SW 2 are arranged in the vicinity of the center of the backplane board 10. The line card slots LC 1 to LC 2, and the line card slots LC 3 to LC 4 are arranged on the left side and the right side of the switch cards respectively. FIG. 9 shows structure which includes two tiers of the same. A connector of the line card slot LC 1 is divided into two areas of an area a and an area b. The area a means 3 rows×10 columns on the left side of a connector area. Similarly, the area b means 3 rows×10 columns on the right side of the connector area. Then, the areas a and b are denoted as LC 1-*a* and LC 1-*b* respectively. These two areas, which are divided, are connected with the switch card slots SW 1 and SW 2 respectively. That is, the area LC 1-*a* of the line card slot LC 1 is connected with an area LC 1-*a* of the switch card slot SW 1. Similarly, the area LC 1-*b* of the line card slot LC 1 is connected with an area LC 1-*b* of the switch card slot SW 2.

Moreover, an area LC 2-*a* of the line card slot LC 2 is connected with an area LC 2-*a* of the switch card slot SW 1, and an area LC 2-*b* of the line card slot LC 2 is connected with an area LC 2-*b* of the switch card slot SW 2. Similarly, the line card slot and the switch card slot are connected each other through areas LC 1-*a* to LC 4-*b*.

Furthermore, the switch card slots SW 1 and SW 2 are arranged so that the switch card slots SW 1 and SW 2 are shifted downward by one column against the line cards LC 1 to LC 4 on the backplane board.

Since there is no wiring in a lateral direction in this case, limitation in the slot interval does not exist. Furthermore, in the case of implementing a plurality of connectors on the line card, since there is no longitudinal wiring, it is possible to implement a plurality of connectors on the line card without securing the wiring area, and consequently it is possible to realize miniaturization.

Modification 2

Figure 10:
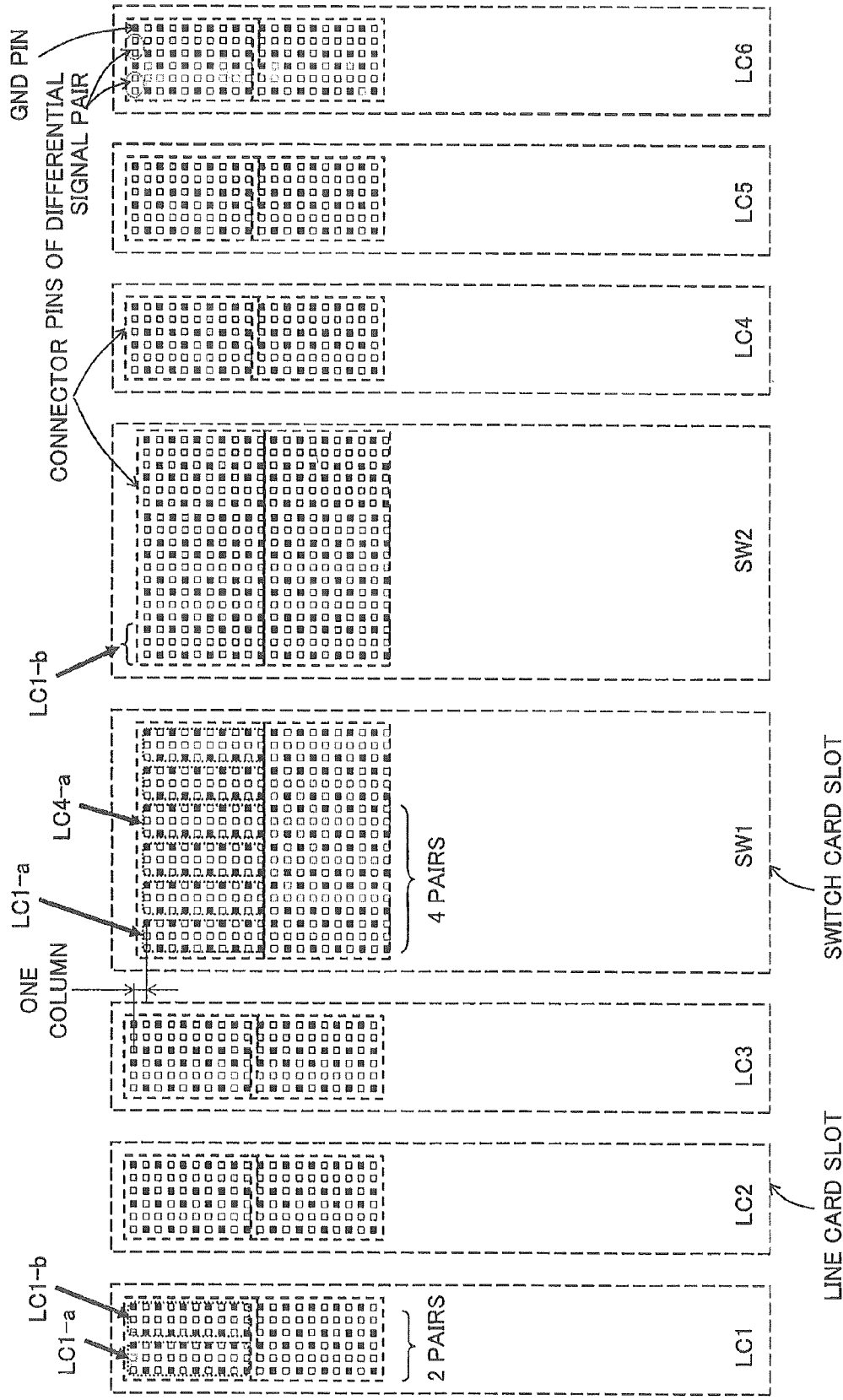
FIG. 10 is a diagram showing composition of a backplane board in a modification in which number of slots is 6.

As a modification 2, FIG. 10 show a backplane board whose number of line card slots is 6. A switch card uses the 6 pairs type connector. As shown in FIG. 10, the switch card slots SW 1 and SW 2 are arranged in the vicinity of the center of the backplane board 10. The line card slots LC 1 to LC 3, and the line card slots LC 4 to LC 6 are arranged on the left side and the right side of the switch cards respectively. FIG. 10 shows structure which includes two tiers of the same. As shown in FIG. 10, a connector of the line card slot LC 1 is divided into two areas of an area a and an area b. The area a means 3 rows×10 columns on the left side of a connector area. Similarly, the area b means 3 rows×10 columns on the right side of the connector area. Then, the areas a and b are denoted as LC 1-*a* and LC 1-*b* respectively. These two areas, which are divided, are connected with the switch card slot SW 1 and SW 2 respectively. That is, the area LC 1-*a* of the line card slot LC 1 is connected with an area LC 1-*a* of the switch card slot SW 1. Similarly, the area LC 1-*b* of the line card slot LC 1 is connected with an area LC 1-*b* of the switch card slot SW 2.

Moreover, an area LC 2-*a* of the line card slot LC 2 is connected with an area LC 2-*a* of the switch card slot SW 1, and an area LC 2-*b* of the line card slot LC 2 is connected with an area LC 2-*b* of the switch card slot SW 2. Similarly, the line card slot and the switch card slot are connected each other through areas LC 1-*a* to LC 6-*b*.

Furthermore, the switch card slots SW 1 and SW 2 are arranged so that the switch card slots SW 1 and SW 2 are shifted downward by one column against the line cards LC 1 to LC 6 on the backplane board.

Since there is no wiring in a lateral direction in this case, limitation in the slot interval does not exist. Furthermore, in the case of implementing a plurality of connectors on the line card, since there is no longitudinal wiring, it is possible to implement a plurality of connectors on the line card without securing the wiring area, and consequently it is possible to realize miniaturization.

Modification 3

Figure 11:
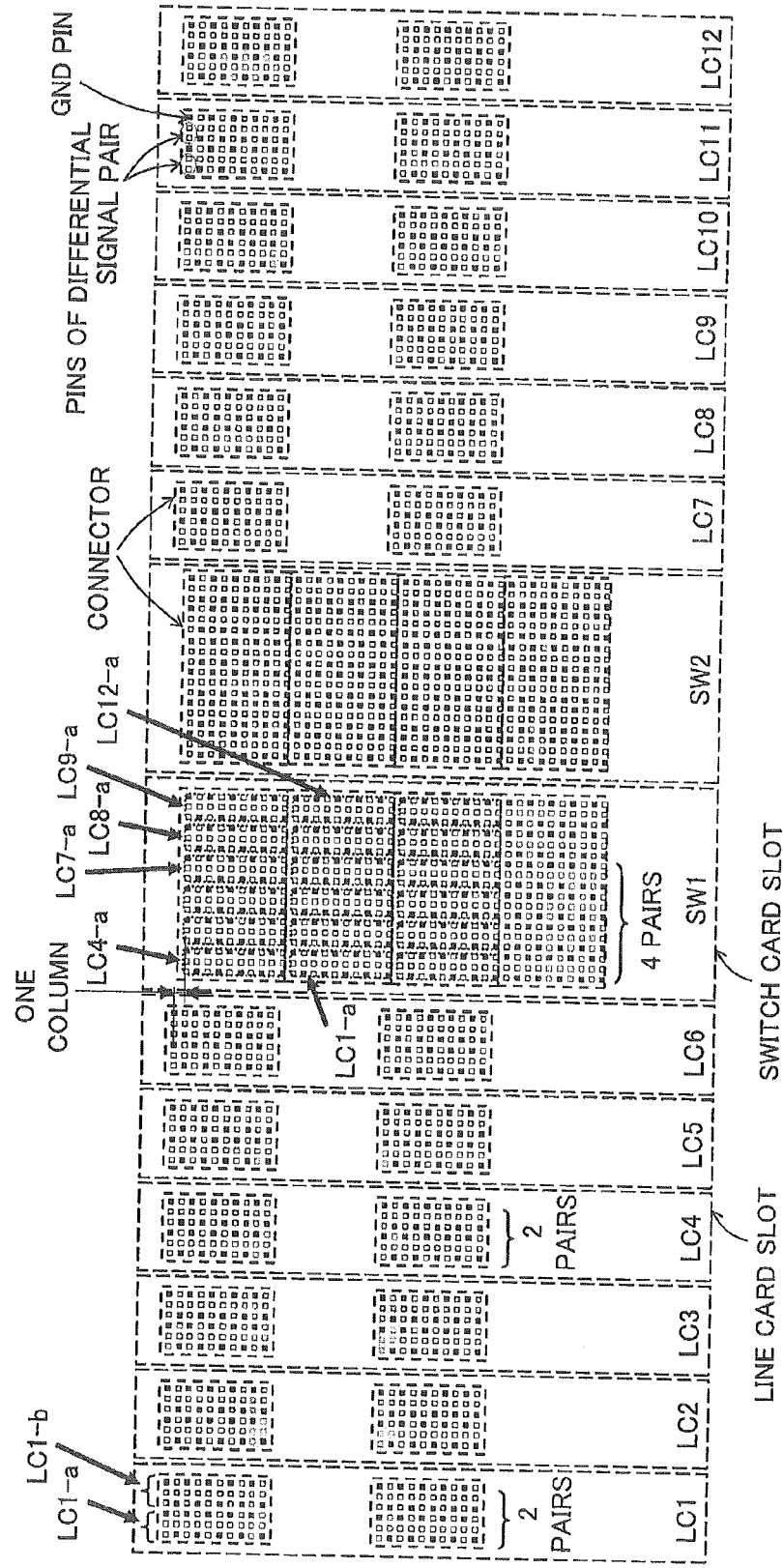
FIG. 11 is a diagram showing composition of a backplane board in a modification in which number of slots is 12.

As a modification 3, FIG. 11 show a backplane board whose number of line card slots is 12. A switch card uses the 6 pairs type connector. As shown in FIG. 11, the switch card slots SW 1 and SW 2 are arranged in the vicinity of the center of the backplane board 10. Moreover, the line card slots LC 1 to LC 6, and the line card slots LC 7 to LC 12 are arranged on the left side and the right side of the switch cards respectively. In FIG. 11, in order to widen the interval between the wirings, the switch card slots have structure of two tiers similarly to FIG. 1 which shows the case of implementing 8 line card slots. FIG. 11 shows structure which includes furthermore two tiers of the same. As shown in FIG. 11, a connector of the line card slot LC 1 is divided into two areas of an area a and an area b. The area a means 3 rows×10 columns on the left side of a connector area. Similarly, the area b means 3 rows×10 columns on the right side of the connector area. Then, the areas a and b are denoted as LC 1-*a* and LC 1-*b* respectively. These two areas, which are divided, are connected with the switch card slots SW 1 and SW 2 respectively. That is, the area LC 1-*a* of the line card slot LC 1 is connected with an area LC 1-*a* of the switch card slot SW 1. Similarly, the area LC 1-*b* of the line card slot LC 1 is connected with an area LC 1-*b* of the switch card slot SW 2.

Moreover, an area LC 2-*a* of the line card slot LC 2 is connected with an area LC 2-*a* of the switch card slot SW 1, and an area LC 2-*b* of the line card slot LC 2 is connected with an area LC 2-*b* of the switch card slot SW 2. Similarly, the line card slot and the switch card slot are connected each other through areas LC 1-*a* to LC 12-*b*.

Furthermore, the switch card slots SW 1 and SW 2 are arranged so that the switch card slots SW 1 and SW 2 are shifted downward by one column against the line cards LC 1 to LC 12 on the backplane board.

Here, the invention of the present application is not limited to these exemplary embodiments mentioned above. Various changes and modifications can be made therein without departing from the spirit and scope of the invention of the present application to carry out the invention of the present application.

This application is based upon and claims the benefit of priority from Japanese Patent Application No. 2012-071412, filed on Mar. 27, 2012, the disclosure of which is incorporated herein in its entirety by reference.

INDUSTRIAL AVAILABILITY

It is possible to use the present invention for designing an electric circuit and a backplane of a communication equipment, an information processing equipment, or the like.

DESCRIPTION OF CODES 1 backplane board
2 repeating board
3 connector
5 logical circuit board
6 connector
10 backplane board
11 first circuit board (line card)
21 second circuit board (switch card)
31 backplane
LC 1 to LC 12 line card slot
SW 1 and SW 2 switch card slot

The invention claimed is:

1. A backplane board, comprising: a first circuit board; a second circuit board; a first slot in which a first connector is connected with the first circuit board; and a second slot in which a second connector is connected with the second circuit board, wherein the first connector and the second connector are arranged so that a pin arrangement of the first connector is configured to be shifted by at least one column in a longitudinal direction against a pin arrangement of the second connector, wherein wirings of the backplane board connect the first connector and the second connector in substantially a state of a straight line, and wherein the wirings of the backplane board directly connect the first connector to the second connector; wherein an entirety of each of the wirings of the backplane board substantially extends in a single line in a direction of the straight line.

2. The backplane board according to claim 1, wherein the second slot is arranged at a center of the backplane board, and the first slots are arranged on both sides of the second slot respectively.

3. The backplane board according to claim 1, wherein the first slots, which are adjacent to each other, are arranged on the backplane board so that a predetermined interval is configured to exist between the first slots.

4. The backplane board according to claim 1, wherein each of the first connector and the second connector includes a 2N pairs type connector (N is a natural number).

5. The backplane board according to claim 1, wherein the first circuit board comprises a line card of a network apparatus, and the second circuit board comprises a switch card of the network apparatus.

6. The backplane board according to claim 1, wherein the wirings of the backplane board connect the first connector to the second connector independent of other components that are located on the backplane board.

7. The backplane board according to claim 1, wherein, from an edge of the first connector to an edge of the second connector, the wirings of the backplane board extend in the straight line.

8. The backplane board according to claim 1, wherein, from an edge of the first connector to an edge of the second connector, the wirings of the backplane board is devoid of a meander extension.

9. The backplane board according to claim 1, wherein the first connector and the second connector are connected through:
  lead wirings extending from edges of the first connector and the second connector; and the wiring extending between the lead wirings in a single line in a direction of the straight line.

10. A wiring method of a backplane board, wherein the backplane board includes: a first circuit board; a second circuit board; a first slot in which a first connector is connected with the first circuit board; and a second slot in which a second connector is connected with the second circuit board, and wherein the wiring method of the backplane board comprises: arranging the first connector and the second connector so that a pin arrangement of the first connector is configured to be shifted by at least one column in a longitudinal direction against a pin arrangement of the second connector; and aligning the first connector and the second connector such that wirings of the backplane board, substantially in a state of a straight line, connect the first connector and the second connector, wherein the wirings of the backplane board directly connect the first connector to the second connector; wherein an entirety of each of the wirings of the backplane board substantially extends in a single line in a direction of the straight line.

11. The wiring method of the backplane board according to claim 10, wherein the second slot is arranged at a center of the backplane board, and the first slots are arranged on both sides of the second slot respectively.

12. The wiring method of the backplane board according to claim 10, wherein the wirings of the backplane board connect the first connector to the second connector independent of other components that are located on the backplane board.

13. The wiring method of the backplane board according to claim 10, wherein, from an edge of the first connector to an edge of the second connector, the wirings of the backplane board extend in the straight line.

14. The wiring method of the backplane board according to claim 10, wherein, from an edge of the first connector to an edge of the second connector, the wirings of the backplane board is devoid of a meander extension.

15. The wiring method of the backplane board according to claim 10, wherein the first connector and the second connector are connected through:
   lead wirings extending from edges of the first connector and the second connector; and
   the wiring extending between the lead wirings in a single line in a direction of the straight line.

* * * * *

UNITED STATES PATENT AND TRADEMARK OFFICE
CERTIFICATE OF CORRECTION

| | | |
|---|---|---|
| PATENT NO. | : 9,603,275 B2 | Page 1 of 1 |
| APPLICATION NO. | : 14/381444 | |
| DATED | : March 21, 2017 | |
| INVENTOR(S) | : Kazuhiro Kashiwakura | |

It is certified that error appears in the above-identified patent and that said Letters Patent is hereby corrected as shown below:

On the Title Page

Item (54) and in the Specification, Column 1, Lines 1-2, should be corrected as follows:

1. Title be changed from "BLACKPLANE BOARD AND WIRING METHOD OF BACKPLANE BOARD" to "BACKPLANE BOARD AND WIRING METHOD OF BACKPLANE BOARD".

Signed and Sealed this
First Day of August, 2017

Joseph Matal
*Performing the Functions and Duties of the*
*Under Secretary of Commerce for Intellectual Property and*
*Director of the United States Patent and Trademark Office*